(12) United States Patent
Lin

(10) Patent No.: US 11,356,109 B1
(45) Date of Patent: Jun. 7, 2022

(54) WIDE-BAND FREQUENCY SYNTHESIZER FOR ZERO-IF WLAN RADIO TRANSCEIVER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/186,120

(22) Filed: Feb. 26, 2021

(51) Int. Cl.
  *H03L 7/185* (2006.01)
  *H03L 7/197* (2006.01)
  *H03L 7/099* (2006.01)
  *H03K 5/00* (2006.01)
  *H03K 21/00* (2006.01)

(52) U.S. Cl.
  CPC .......... *H03L 7/185* (2013.01); *H03K 5/00006* (2013.01); *H03K 21/00* (2013.01); *H03L 7/0991* (2013.01); *H03L 7/1976* (2013.01)

(58) Field of Classification Search
  CPC ..... H03L 7/185; H03L 7/0991; H03L 7/1976; H03K 5/00006; H03K 21/00
  USPC ........................................................ 327/115
  See application file for complete search history.

(56) References Cited

U.S. PATENT DOCUMENTS

| | | | |
|---|---|---|---|
| 4,636,733 A | 1/1987 | Charbonnier et al. | |
| 4,659,999 A | 4/1987 | Motoyama et al. | |
| 6,049,238 A * | 4/2000 | Shimizu | H03K 3/86 |
| | | | 327/156 |
| 7,498,856 B2 | 3/2009 | Lin et al. | |
| 7,888,978 B2 * | 2/2011 | Kuroda | H03L 7/185 |
| | | | 327/107 |
| 10,250,189 B1 | 4/2019 | Lin | |
| 10,404,316 B1 * | 9/2019 | Song | H04L 7/033 |
| 10,469,061 B1 | 11/2019 | Lin | |
| 10,613,575 B1 | 4/2020 | Lin | |

(Continued)

FOREIGN PATENT DOCUMENTS

KR  100883382 B1  2/2009

OTHER PUBLICATIONS

TW Office Action dated Oct. 13, 2021 issued in Taiwan application No. 110113804.

(Continued)

*Primary Examiner* — Ryan Jager
(74) *Attorney, Agent, or Firm* — McClure, Qualey & Rodack, LLP

(57) ABSTRACT

A frequency synthesizer includes a clock multiplier unit configured to receive a first clock and output a second clock in accordance with a multiplication factor; a divide-by-three circuit configured to receive the second clock and output a third clock; a first divide-by-two circuit configured to receive the second clock and output a fourth clock; a second divide-by-two circuit configured to receive the fourth clock and output a fifth clock; a first multiplexer configured to receive the third clock and the fourth clock and output a seventh clock in accordance with a first selection signal; a second multiplexer configured to receive the third clock and the fifth clock and output an eighth clock in accordance with a second selection signal; and a mixer configured to receive the seventh clock and the eighth clock and output an output clock.

20 Claims, 3 Drawing Sheets

(56) References Cited

U.S. PATENT DOCUMENTS

2007/0008429 A1    1/2007   Cha et al.
2012/0015610 A1    1/2012   Ruffieux
2012/0081155 A1*   4/2012   Li .................. H03B 5/1228
                                                                           327/105

OTHER PUBLICATIONS

Search Report issued in TW Office Action dated Oct. 13, 2021 issued in Taiwan application No. 110113804.

* cited by examiner

WIDE-BAND FREQUENCY SYNTHESIZER FOR ZERO-IF WLAN RADIO TRANSCEIVER AND METHOD THEREOF

BACKGROUND OF THE DISCLOSURE

Field of the Disclosure

The present disclosure generally relates to frequency synthesizers and more particularly to frequency synthesizers and methods having a tunable voltage-controlled oscillator (VCO).

Description of Related Art

A radio frequency synthesizer used by a WLAN (wireless local area network) radio transceiver to transmit and receive a radio signal covers a range approximately from 4.8 GHz to 7.2 GHz. In a zero-IF (intermediate frequency) radio transceiver, a frequency synthesizer that can generate a clock of the same frequency as the radio signal is needed. Therefore, a zero-IF WLAN radio transceiver needs a frequency synthesizer that can generate a clock of a frequency approximately ranging from 4.8 GHz to 7.2 GHz. A frequency synthesizer is usually embodied by using a CMU (clock multiplier unit) that comprises a PLL (phase lock loop). A critical building block of a PLL is a VCO (voltage-controlled oscillator), which is configured to output a clock of a frequency that is tunable and controlled in a closed-loop matter such that the frequency of the clock can be precisely determined. For a VCO, the wider tunable range, the more difficult to design.

As an example, in U.S. Pat. No. 10,404,316 (incorporated herein by reference), Song et al disclosed a zero-IF WLAN radio transceiver utilizing a frequency synthesizer that requires a VCO of a tunable range from 7.68 GHz to 9.60 GHz.

What is desired is a frequency synthesizer that relaxes a tunable range of the VCO yet can still satisfy the frequency range needed for the zero-IF WLAN radio transceiver.

SUMMARY OF THE DISCLOSURE

In an embodiment, a frequency synthesizer comprises: a clock multiplier unit configured to receive a first clock and output a second clock in accordance with a multiplication factor; a divide-by-three circuit configured to receive the second clock and output a third clock; a first divide-by-two circuit configured to receive the second clock and output a fourth clock; a second divide-by-two circuit configured to receive the fourth clock and output a fifth clock; a first multiplexer configured to receive the third clock and the fourth clock and output a seventh clock in accordance with a first selection signal; a second multiplexer configured to receive the third clock and the fifth clock and output an eighth clock in accordance with a second selection signal; and a mixer configured to receive the seventh clock and the eighth clock and output an output clock.

In an embodiment, a method of frequency synthesis comprises: receiving a first clock; multiplying the first clock into a second clock using a clock multiplier unit in accordance with a multiplication factor; using a divide-by-three circuit to divide the second clock into a third clock; using a first divide-by-two circuit to divide the second clock into a fourth clock; using a second divide-by-two circuit to divide the fourth clock into a fifth clock; using a first multiplexer to output a seventh clock by selecting between the third clock and the fourth clock in accordance with a first selection signal; using a second multiplexer to output an eighth clock by selecting among a plurality of clocks including the third clock and the fifth clock in accordance with a second selection signal; and generating an output clock by mixing the seventh clock with the eighth clock using a mixer.

DETAILED DESCRIPTION OF THIS DISCLOSURE

Figure 1:
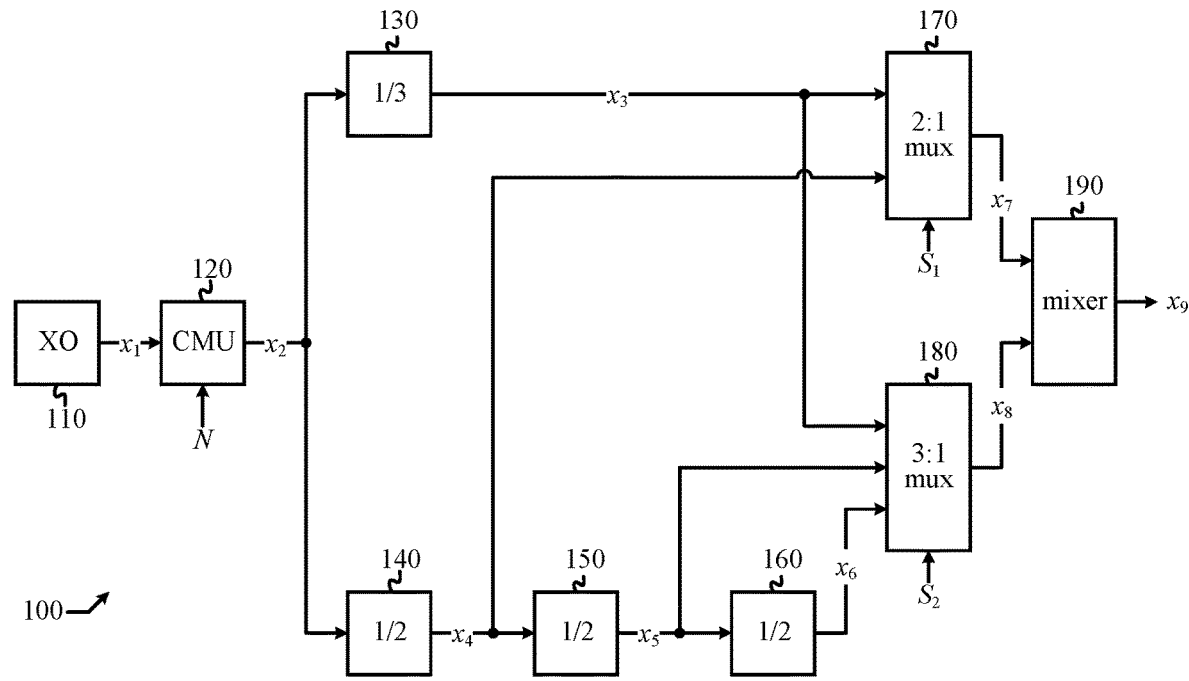
FIG. 1 shows a functional block diagram of a frequency synthesizer in accordance with an embodiment of the present disclosure.

The present disclosure is directed to frequency synthesizer. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "clock," "frequency," "phase-lock loop," "data flip-flop," "edge trigger," "NAND gate," "mixer," "logical signal," "ternary signal," "four-phase clock," "multiplexer," "clock multiplier unit (CMU)." Terms and basic concepts like these, when used in a context of microelectronics, are apparent to those of ordinary skill in the art and thus will not be explained in detail here.

Those of ordinary skill in the art can read schematics of a circuit comprising components such as data flip-flop (DFF) and NAND gate and do not need an explanation about how one component connects with another in the schematics. Those of ordinary skill in the art also understand units such as GHz (giga-Hertz) and thus no explanations are needed.

A circuit is a collection of a transistor, a capacitor, a resistor, and/or other electronic devices inter-connected in a certain manner to embody a certain function.

A signal is a voltage of a variable level that carry a certain information and can vary with time. A level of the signal at a moment represents a state of the signal at that moment.

A logical signal is a voltage signal of two states: a low state and a high state. The low state is also known as a "0" state, while the high stage is also known as a "1" state. Regarding a logical signal Q, when we say, "Q is high" or "Q is low," what we mean is "Q is in the high state" or "Q is in the low state." Likewise, when we say, "Q is 1" or "Q is 0," what we mean is "Q is in the 1 state" or "Q is in the 0 state."

Upon a low-to-high transition of a logical signal, a rising edge occurs; upon a high-to-low transition of a logical signal, a falling edge occurs.

A first logical signal is said to be a logical inversion of a second logical signal if the first logical signal and the second logical signal always have opposite states. That is, when the first logical signal is 1, the second logical signal will be 0; when the first logical signal is 0, the second logical signal will be 1. When a first logical signal is a logical inversion of a second logical signal, the first logical signal is said to be complementary to the second logical signal.

A ternary signal is a three-state composite signal that can be represented by two logical signals.

A clock is a logical signal that periodically toggles back and forth between a low state and a high stage. When a clock toggles from low to high and then toggles back from high to low, it is said to complete one cycle. A frequency of a clock indicates a number of cycles the clock completes per second.

A data flip flop (DFF) receives an input signal at a data pin labeled by "D" and outputs an output signal at an output pin labeled by "Q" along with a complementary output signal at a complementary output pin labeled by "QB" in accordance with a triggering signal at a trigger pin labeled by a wedge symbol; the input signal, the output signal, the complementary output signal, and the triggering signal are all logical signals. For a positive (negative) edge triggered DFF, upon a rising (rising) edge of the triggering signal, a state of the input signal is loaded to the output signal, while an opposite state of the input signal is loaded to the complementary output signal. By default, a DFF is positive edge triggered. When a DFF is negative edge triggered, a small circle is placed at the trigger pin to indicate a logical inversion of the triggering signal.

A multiplexer receives a plurality of inputs and outputs an output by selecting among said plurality of inputs in accordance with a selection signal, which has a plurality of states that correspond to said plurality of inputs, respectively. A two-to-one multiplexer receives two inputs and outputs an output in accordance with a selection signal that is a logical signal and has two states corresponding to the two inputs, respectively; a three-to-one multiplexer receives three inputs and outputs an output in accordance with a selection signal that is a ternary signal and has three states corresponding to the three inputs, respectively.

A functional block diagram of a frequency synthesizer 100 in accordance with an embodiment of the present disclosure is depicted in FIG. 1. Frequency synthesizer 100 comprises: a clock multiplier unit (denoted by "CMU") configured to receive a first clock $x_1$, which by way of example but not limitation is generated by a crystal oscillator (denoted by "XO") 110, and output a second clock $x_2$ in accordance with a multiplication factor N; a divide-by-three circuit (denoted by "1/3") 130 configured to receive the second clock $x_2$ and output a third clock $x_3$; a first divide-by-two circuit (denoted by "1/2") 140 configured to receive the second clock $x_2$ and output a fourth clock $x_4$; a second divide-by-two circuit (denoted by "1/2") 150 configured to receive the fourth clock $x_4$ and output a fifth clock $x_5$; a third divide-by-two circuit (denoted by "1/2") 160 configured to receive the fifth clock $x_5$ and output a sixth clock $x_6$; a two-to-one multiplexer (denoted by "2:1 mux") 170 configured to receive the third clock $x_3$ and the fourth clock $x_4$ and output a seventh clock $x_7$ in accordance with a first selection signal $S_1$; a three-to-one multiplexer (denoted by "3:1 mux") 180 configured to receive the third clock $x_3$, the fifth clock $x_5$, and the sixth clock $x_6$ and output an eighth clock $x_8$ in accordance with a second selection signal $S_2$; and a mixer 190 configured to receive the seventh clock $x_7$ and the eighth clock $x_8$ and output a ninth clock $x_9$, which is an output clock of frequency synthesizer 100. By way of example but not limitation, an objective of frequency synthesizer 100 is to have the ninth clock $x_9$ be tunable and cover a (frequency) range from 4.80 GHz to 7.2 GHz without the need for CMU 120 to have a wide tunable (frequency) range.

Figure 2:
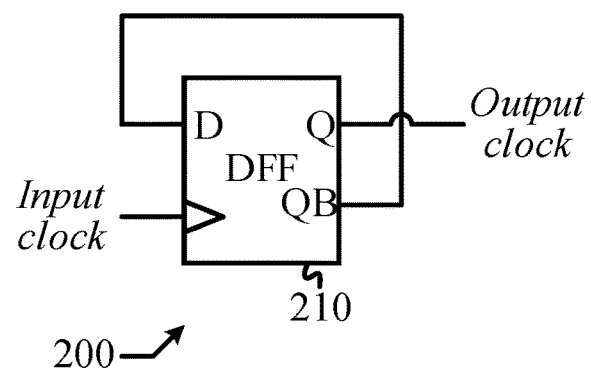
FIG. 2 shows a schematic diagram of a divide-by-two circuit.

A divide-by-two circuit, such as divide-by-two circuits 140, 150, and 160, receives an input clock and outputs an output clock such that a frequency of the output clock is equal to one half of a frequency of the input clock. A schematic diagram of a divide-by-two circuit 200 that can be instantiated to embody divide-by-two circuits 140, 150, and 160 is shown in FIG. 2. Divide-by-two circuit 200 comprises a data flip-flop (DFF) 210 that has a data pin labeled by "D," an output pin labeled by "Q," a complementary output pin labeled by "QB," and a trigger pin labeled by a wedge symbol, wherein DFF 210 is configured in a negative feedback manner to output the output clock in accordance with a trigger by the input clock. Divide-by-two circuit 200, along with the symbol, the function, the principle, and the circuit implementation of a data flip-flop such as DFF 210 are well understood by those of ordinary skill in the art and thus not described in detail here.

Figure 3:
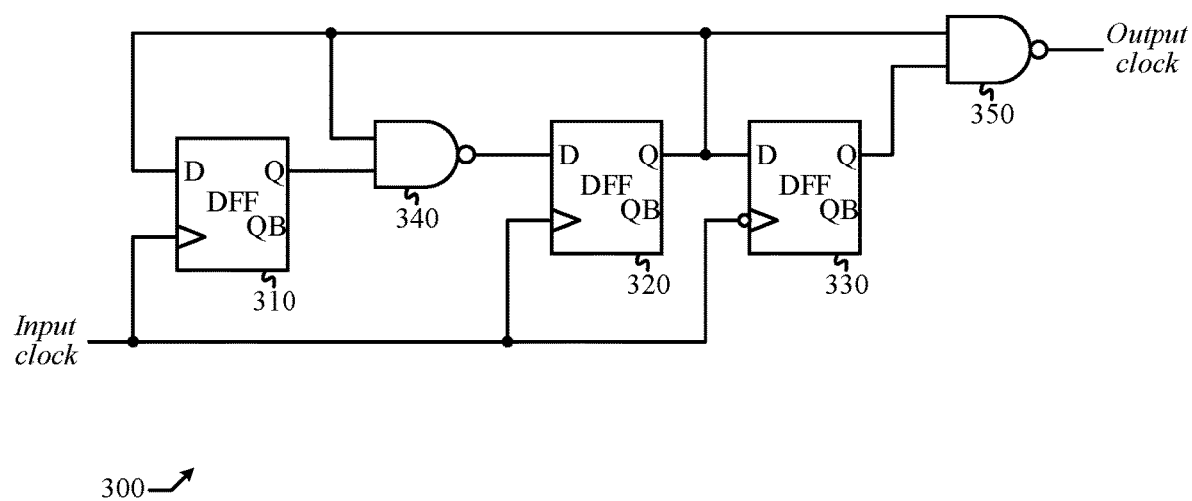
FIG. 3 shows a schematic diagram of a divide-by-three circuit.

A divide-by-three circuit, such as divide-by-three circuit 130, receives an input clock and outputs an output clock such that a frequency of the output clock is equal to one third of a frequency of the input clock. A schematic diagram of a divide-by-three circuit 300 that can be instantiated to embody divide-by-three circuits 130 is shown in FIG. 3. Divide-by-three circuit 300 comprises three data flip-flops (DFF) 310, 320, and 330, along with two NAND gates 340 and 350. DFF 310, DFF 320, and NAND gate 340 embody a divide-by-three function that is well known in the prior art and thus not described in detail here. DFF 330 and NAND gate 350 are used to make the output clock have a 50% duty cycle, which is not mandatory but highly desirable; these are well known in the prior art and thus not described in detail here. Note that DFF 330 is negative edge triggered (as marked by a small circle at the trigger pin that indicates a logical inversion), while DFF 310 and DFF 320 are positive edge triggered.

Let frequencies of $x_1$, $x_2$, $x_3$, $x_4$, $x_5$, $x_6$, $x_7$, $x_8$, and $x_9$ be $f_1$, $f_2$, $f_3$, $f_4$, $f_5$, $f_6$, $f_7$, $f_8$, and $f_9$, respectively. Crystal oscillator 110 is configured to output $x_1$ in a way that its frequency $f_1$ is highly precise and stable. Crystal oscillators are well known in the prior art and thus not described in detail here. CMU 120 is configured to make the frequency of $x_2$ be equal to the frequency of $x_1$ multiplied by the multiplication factor N, i.e.

$$f_2 = N \cdot f_1 \qquad (1)$$

In an embodiment, the multiplication factor N is a number comprising an integer part and a fractional part. In an embodiment, CMU 120 is a fractional-N phase lock loop (PLL) comprising a VCO (voltage-controlled oscillator) configured to generate the second clock $x_2$ that is controlled in a closed-loop manner to track a phase of the first clock $x_1$. Fractional-N phase lock loops are well known in the prior art and thus not described in detail here. An example of a fractional-N PLL can be found in U.S. Pat. No. 7,498,856, incorporated hereby by reference.

Divide-by-three circuit 130 is configured to make the frequency of $x_3$ be equal to one third of the frequency of $x_2$, i.e.

$$f_3 = f_2 / 3 \qquad (2)$$

The first divide-by-two circuit 140 is configured to make the frequency of $x_4$ be equal to one half of the frequency of $x_2$, i.e.

$$f_4 = f_2/2 \quad (3)$$

The second divide-by-two circuit 150 is configured to make the frequency of $x_5$ be equal to one half of the frequency of $x_4$, i.e.

$$f_5 = f_4/2 \quad (4)$$

The third divide-by-two circuit 160 is configured to make the frequency of $x_6$ be equal to one half of the frequency of $x_5$, i.e.

$$f_6 = f_5/2 \quad (5)$$

The two-to-one multiplexer 170 performs a clock selection function; the first selection signal $S_1$ is a logical signal of two possible states 0 and 1; when $S_1$ is 0; $x_3$ is selected; and when $S_1$ is 1, $x_4$ is selected. That is:

$$x_7 = \begin{cases} x_3 & \text{if } S_1 \text{ is } 0 \\ x_4 & \text{if } S_1 \text{ is } 1 \end{cases} \quad (6)$$

A two-to-one multiplexer is well known in the prior art and thus not described in detail here; there are numerous ways of implementation known in the prior art that those skilled in the art can choose at their discretion.

The three-to-one multiplexer 180 performs a clock selection function; the second selection signal $S_2$ is a ternal signal of three possible states 0, 1, and 2; when $S_2$ is 0; $x_3$ is selected; when $S_2$ is 1, $x_5$ is selected; and when $S_2$ is 2, $x_6$ is selected. That is:

$$x_8 = \begin{cases} x_3 & \text{if } S_2 \text{ is } 0 \\ x_5 & \text{if } S_2 \text{ is } 1 \\ x_6 & \text{if } S_2 \text{ is } 2 \end{cases} \quad (7)$$

A three-to-one multiplexer is well known in the prior art and thus not described in detail here; there are numerous ways of implementation known in the prior art that those skilled in the art can choose at their discretion.

Mixer 190 performs a frequency mixing of $x_7$ and $x_8$ so that the frequency of $x_9$ is equal to a sum of the frequency of $x_7$ and the frequency of $x_8$, i.e.

$$f_9 = f_7 + f_8 \quad (8)$$

Using equations (2), (3), (4), (5), (6), (7), and (8), we can establish a relation between $f_2$ and $f_9$ in accordance with states of $S_1$ and $S_2$:

|  | $S_2 = 0$ | $S_2 = 1$ | $S_2 = 2$ |
|---|---|---|---|
| $S_1 = 0$ | $f_7 = f_2/3$ | $f_7 = f_2/3$ | $f_7 = f_2/3$ |
|  | $f_8 = f_2/3$ | $f_8 = f_2/4$ | $f_8 = f_2/8$ |
|  | $f_9 = 2f_2/3$ | $f_9 = 7f_2/12$ | $f_9 = 11f_2/24$ |
| $S_1 = 1$ | $f_7 = f_2/2$ | $f_7 = f_2/2$ | $f_7 = f_2/2$ |
|  | $f_8 = f_2/3$ | $f_8 = f_2/4$ | $f_8 = f_2/8$ |
|  | $f_9 = 5f_2/6$ | $f_9 = 3f_2/4$ | $f_9 = 5f_2/8$ |

Therefore, $f_9$ can be as low as $11f_2/24$, and as high as $5f_2/6$. The range is very wide.

Mixers are well known in the prior art and thus not described in detail here; there are numerous ways of implementation known in the prior art that those skilled in the art can choose to embody mixer 190 at their discretion. In an embodiment, mixer 190 includes a resonant tank that is tuned to the desired frequency of $x_9$ to suppress undesired mixing products; this concept along with implementation are well known in the prior art and thus not described in detail here. In an embodiment, mixer 190 is a SSB (single-sideband) mixer, and $x_3$, $x_4$, $x_5$, $x_6$, $x_7$, and $x_8$ are all four-phase clocks. "SSB mixer" and "four-phase clock" are well understood by those of ordinary skill in the art and thus not described in detail here. An implementation of a SSB mixer can be found in U.S. Pat. No. 10,250,189 (incorporated herein by reference), which is also an example of using a resonant tank to suppress undesired mixing products. In an embodiment, the quadrature clock generator disclosed in U.S. Pat. No. 10,613,575 (incorporated herein by reference) is used to embody divide-by-two circuits 140, 150, and 160; in this case, $x_4$, $x_5$, are $x_6$ are readily four-phase clocks. In an embodiment, the quadrature clock generator disclosed in U.S. Pat. No. 10,469,061 (incorporated herein by reference) is incorporated in the divided-by-three circuit 130 so that $x_3$ can be a four-phase clock.

By way of example but not limitation, in an embodiment: frequency synthesizer 100 is configured to be used in a zero-IF WLAN radio transceiver where a clock of a frequency ranging from 4.80G to 7.20G is needed; $f_1$ is 40 MHz; the multiplication factor N is between 192 and 216; $f_2$ is between 7.680 GHz and 8.640 GHz; $f_9$ is between 4.80 GHz and 7.20 GHz; and states of $S_1$ and $S_2$ are tabulated in the table below:

| $f_9$ (GHz) | $f_2$ (GHz) | $S_1$ | $f_7$ (GHz) | $S_2$ | $f_8$ (GHz) |
|---|---|---|---|---|---|
| 4.80~5.12 | 7.680~8.192 | 1 | 3.840~4.096 | 2 | 0.960~1.024 |
| 5.12~5.76 | 7.680~8.640 | 0 | 2.560~2.880 | 0 | 2.560~2.880 |
| 5.76~6.48 | 7.680~8.640 | 1 | 3.840~4.320 | 1 | 1.920~2.160 |
| 6.48~7.20 | 7.776~8.640 | 1 | 3.888~4.320 | 0 | 2.592~2.880 |

That is, by properly setting states of $S_1$ and $S_2$, $f_9$ can cover a range from 4.80 GHz to 7.20 GHz with $f_2$ ranging from 7.680 GHz to 8.640 GHz. This means, when CMU 120 is embodied by a fractional-N PLL comprising a VCO, the requirement on the tunable range of the VCO is from 7.680 GHz to 8.640 GHz. As such, this present disclosure greatly relaxes the requirement of the tunable range of the VCO, compared to what was disclosed in U.S. Pat. No. 10,404,316.

Note that some radio transceivers may not need the frequency range (of $f_9$) between 4.80 GHz and 5.12 GHz; in this case, there is no need for the sixth clock $x_6$ and the $S_2=2$ state, therefore the frequency synthesizer 100 can be simplified by removing the third divide-by-two circuit 160, and the three-to-one multiplexer 180 can be reduced to a two-to-one multiplexer, and the second selection signal $S_2$ becomes a logical signal, since the original selection option of the sixth clock $x_6$ is removed. In other words, the third divide-by-two circuit 160 is optional, depending on whether the frequency range between 4.80 GHz and 5.12 GHz is needed.

Figure 4:
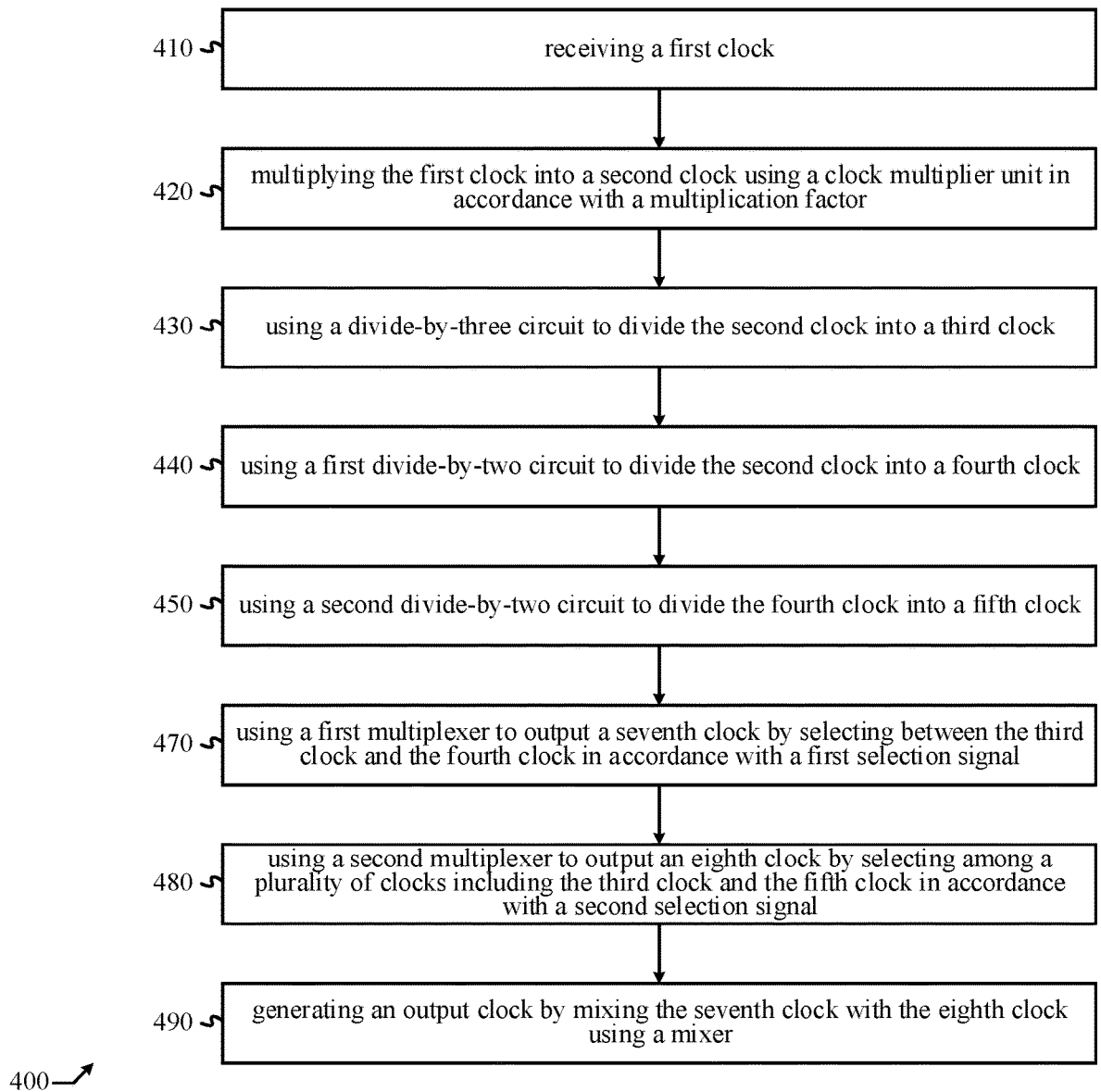
FIG. 4 shows a flow diagram of a method of frequency synthesis in accordance with an embodiment of the present disclosure.

As demonstrated by a flow diagram 400 shown in FIG. 4, a method of frequency synthesis comprises the following steps: (step 410) receiving a first clock; (step 420) multiplying the first clock into a second clock using a clock multiplier unit in accordance with a multiplication factor; (step 430) using a divide-by-three circuit to divide the second clock into a third clock; (step 440) using a first divide-by-two circuit to divide the second clock into a fourth clock; (step 450) using a second divide-by-two circuit to divide the fourth clock into a fifth clock; (step 470) using a first multiplexer to output a seventh clock by selecting between the third clock and the fourth clock in accordance with a first selection signal; (step 480) using a second multiplexer to output an eighth clock by selecting among a plurality of clocks including the third clock and the fifth clock in accordance with a second selection signal; and (step 490) generating an output clock by mixing the seventh clock with the eighth clock using a mixer.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A frequency synthesizer comprising:
   a clock multiplier unit configured to receive a first clock and output a second clock in accordance with a multiplication factor;
   a divide-by-three circuit configured to receive the second clock and output a third clock;
   a first divide-by-two circuit configured to receive the second clock and output a fourth clock;
   a second divide-by-two circuit configured to receive the fourth clock and output a fifth clock;
   a first multiplexer configured to receive the third clock and the fourth clock and output a seventh clock in accordance with a first selection signal;
   a second multiplexer configured to receive the third clock and the fifth clock and output an eighth clock in accordance with a second selection signal; and
   a mixer configured to receive the seventh clock and the eighth clock and output an output clock.

2. The frequency synthesizer of claim 1, wherein the multiplication factor comprises an integer part and a fractional part.

3. The frequency synthesizer of claim 2, wherein the clock multiplier unit comprises a fractional-N phase lock loop including a voltage-controlled oscillator configured to generate the second clock that is controlled in a closed loop manner to track a phase of the first clock.

4. The frequency synthesizer of claim 1, wherein the first selection signal is a logical signal and the first multiplexer is a two-to-one multiplexer.

5. The frequency synthesizer of claim 1, wherein the second selection signal is a logical signal and the second multiplexer is a two-to-one multiplexer.

6. The frequency synthesizer of claim 1, wherein the mixer includes a resonant tank tuned to a specified frequency of the output clock.

7. The frequency synthesizer of claim 1, wherein the mixer is a single side-band mixer.

8. The frequency synthesizer of claim 7, wherein the third clock, the fourth clock, the fifth clock, the seventh clock, and the eighth clock are all four-phase clocks.

9. The frequency synthesizer of claim 1 further comprising a third divide-by-two circuit configured to receive the fifth clock and output a sixth clock.

10. The frequency synthesizer of claim 9, wherein the second selection signal is a ternary signal, the second multiplexer is a three-to-one multiplexer, and the eighth clock is selected among the third clock, the fifth clock, and the sixth clock.

11. A method of frequency synthesis comprising:
    receiving a first clock;
    multiplying the first clock into a second clock using a clock multiplier unit in accordance with a multiplication factor;
    using a divide-by-three circuit to divide the second clock into a third clock;
    using a first divide-by-two circuit to divide the second clock into a fourth clock;
    using a second divide-by-two circuit to divide the fourth clock into a fifth clock;
    using a first multiplexer to output a seventh clock by selecting between the third clock and the fourth clock in accordance with a first selection signal;
    using a second multiplexer to output an eighth clock by selecting among a plurality of clocks including the third clock and the fifth clock in accordance with a second selection signal; and
    generating an output clock by mixing the seventh clock with the eighth clock using a mixer.

12. The method of frequency synthesis of claim 11, wherein the multiplication factor comprises an integer part and a fractional part.

13. The method of frequency synthesis of claim 12, wherein the clock multiplier unit comprises a fractional-N phase lock loop including a voltage-controlled oscillator configured to generate the second clock that is controlled in a closed loop manner to track a phase of the first clock.

14. The method of frequency synthesis of claim 11, wherein the first selection signal is a logical signal and the first multiplexer is a two-to-one multiplexer.

15. The method of frequency synthesis of claim 11, wherein the second selection signal is a logical signal and the second multiplexer is a two-to-one multiplexer.

16. The method of frequency synthesis of claim 11, wherein the mixer includes a resonant tank tuned to a specified frequency of the output clock.

17. The method of frequency synthesis of claim 11, wherein the mixer is a single side-band mixer.

18. The method of frequency synthesis of claim 17, wherein the third clock, the fourth clock, the fifth clock, the seventh clock, and the eighth clock are all four-phase clocks.

19. The method of frequency synthesis of claim 11 further comprising a third divide-by-two circuit configured to receive the fifth clock and output a sixth clock.

20. The method of frequency synthesis of claim 19, wherein the second selection signal is a ternary signal, the second multiplexer is a three-to-one multiplexer, and the eighth clock is selected among the third clock, the fifth clock, and the sixth clock.

* * * * *